US009929723B2

(12) United States Patent
Zyuban et al.

(10) Patent No.: US 9,929,723 B2
(45) Date of Patent: Mar. 27, 2018

(54) FLIP FLOP USING DUAL INVERTER FEEDBACK

(71) Applicant: Apple Inc., Cupertino, CA (US)

(72) Inventors: Victor Zyuban, Sunnyvale, CA (US); Neela Lohith Penmetsa, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 135 days.

(21) Appl. No.: 15/066,809

(22) Filed: Mar. 10, 2016

(65) Prior Publication Data
US 2017/0264274 A1    Sep. 14, 2017

(51) Int. Cl.
*H03K 3/3562* (2006.01)
*H03K 3/356* (2006.01)

(52) U.S. Cl.
CPC ... *H03K 3/35625* (2013.01); *H03K 3/356173* (2013.01)

(58) Field of Classification Search
CPC ... H03K 3/0372; H03K 3/289; H03K 3/35625
USPC ............... 327/199, 200, 202, 203, 208, 225
See application file for complete search history.

(56) References Cited

U.S. PATENT DOCUMENTS

| 6,087,886 | A | 7/2000 | Ko |
| 6,198,324 | B1 | 3/2001 | Schober |
| 6,597,223 | B2 | 7/2003 | Vangal et al. |
| 6,906,558 | B2 * | 6/2005 | Lee ........................ H03K 3/012 327/208 |
| 8,164,363 | B1 * | 4/2012 | Su ..................... H03K 3/356139 327/208 |
| 8,493,119 | B2 * | 7/2013 | Leach .................... H03K 3/012 327/202 |
| 8,829,963 | B1 | 9/2014 | Bartling et al. |

* cited by examiner

*Primary Examiner* — Lincoln Donovan
*Assistant Examiner* — Colleen O Toole
(74) *Attorney, Agent, or Firm* — Fenwick & West LLP

(57) ABSTRACT

Embodiments of the present disclosure relate to a flip flop circuit that obviates the need of a transmission gate. The flip flop includes a first match multiplexer, a second match multiplexer and a separable inverter. The first match multiplexer receives an input data signal and generates a feedback output based on the input data signal and the logic levels at two nodes coupled to the first match multiplexer. The separable inverter receives the feedback output and switches the logic level of one of two nodes but maintains the logic level per each clock cycle. The second match multiplexer generates a signal output based on the logic levels at the two nodes and the signal output that is fed back into the second match multiplexer. Embodiments may reduce power consumption and operate at lower voltages.

20 Claims, 11 Drawing Sheets

FLIP FLOP USING DUAL INVERTER FEEDBACK

BACKGROUND

1. Field of Technology

The present disclosure generally relates to flip flops, and specifically relates to master slave flip flops.

2. Background

Flip flops are data storage elements used in digital electronic circuits. Flip flops store one of two states and changes states in response to one or more inputs. A typical master slave flip flop is made of a master latch and a slave latch that change states in response to a control signal such as a clock. The output of the master latch is the input to the slave latch, and the output of the slave latch is the output of the flip flop. During the negative phase of the clock, the master latch stores a data input signal while the slave latch maintains its previously stored value. During the positive phase of the clock, the master latch maintains its previously stored value while the slave latch stores the data input signal previously stored in the master latch, thus the data input signal is written to the output of the flip flop.

One of many problems with typical master slave flip flops is that the slave latch and the master latch could both be acquiring or storing new data at the same time. For example, during a positive clock phase, the master latch maintains the input data from the previous clock phase while the slave latch acquires new data. During a negative clock phase, the master latch acquires new input data while the slave latch maintains the input data from the previous clock phase. During the transition from the positive to negative clock phase, the slave latch may change to a maintaining mode before the master latch changes to an acquiring mode. However, it is possible that the master latch changes to an acquiring mode before the slave latch changes to a maintaining mode, both the master latch and slave latch in an acquiring mode, causing the output value of the flip flop to be compromised.

SUMMARY

Embodiments of the present disclosure relate to a flip flop circuit that obviates the need for a transmission gate. The flip flop may include a first match multiplexer, a second match multiplexer and a separable inverter. The first match multiplexer receives an input data signal and generates a feedback output based on the input data signal and the logic levels at two nodes coupled to the first match multiplexer. The separable inverter receives the feedback output and switches the logic level of one of two nodes but maintains the logic level per each clock cycle. The second match multiplexer generates a signal output based on the logic levels at the two nodes and the signal output that is fed back into the second match multiplexer.

In one embodiment the first match multiplexer generates a first feedback signal that is the inverse of the logic level at the two nodes when they are the same logic levels and the inverse of the input data signal when the two nodes are at different logic levels. The separable inverter sets the logic level of the nodes to different logic levels in response to a falling edge of the clock and sets the logic level of the nodes to the same logic level, the inverse of the first feedback signal, in response to a rising edge of the clock. The second match multiplexer generates a second feedback signal that is the inverse of the logic level of the two nodes when they are the same logic level and maintains the second feedback signal when the two nodes are at different logic levels.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

Figure 1:
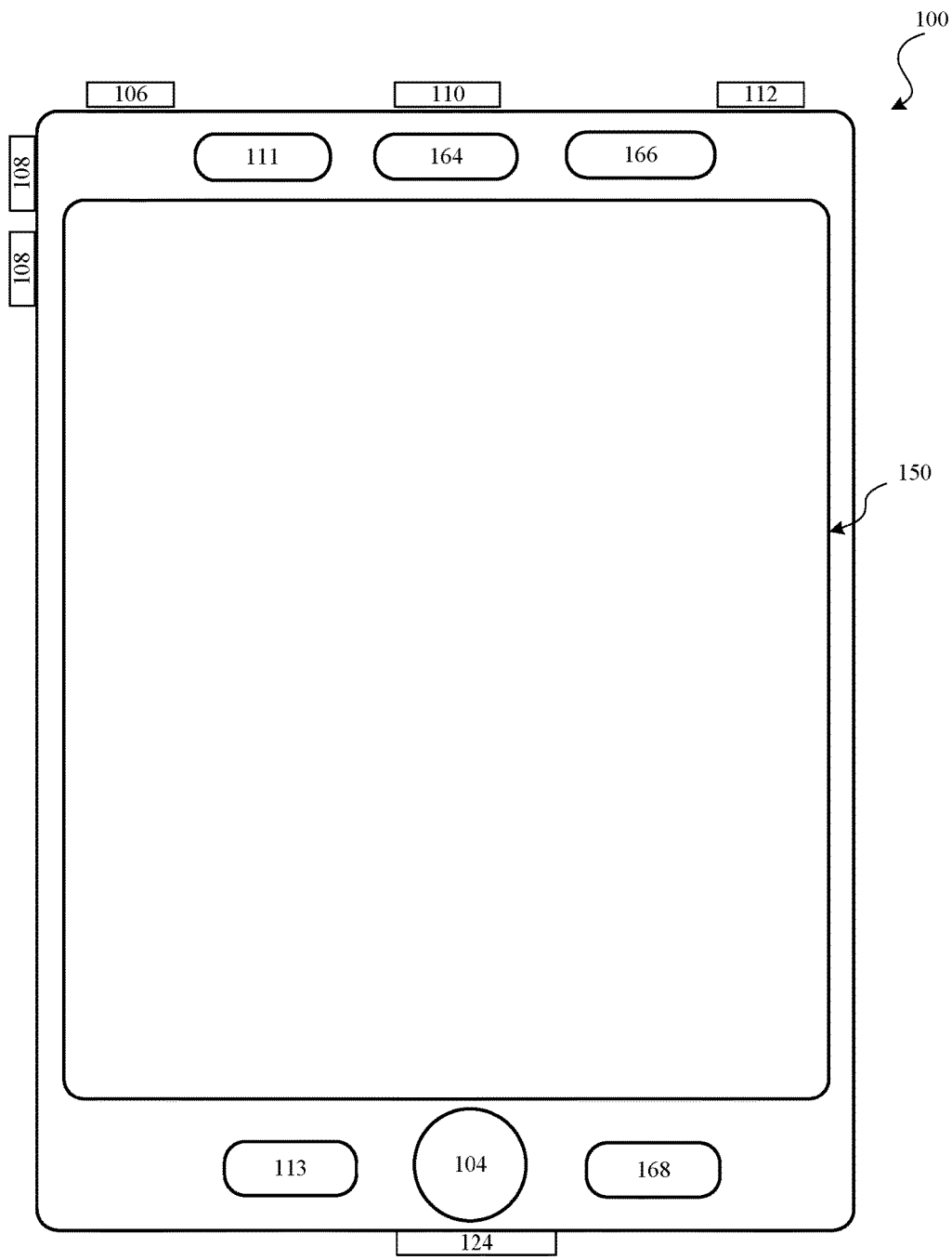
FIG. 1 is a high-level diagram of a portable electronic device, according to one embodiment.

The figures depict, and the detail description describes, various non-limiting embodiments for purposes of illustration only. One skilled in the art will readily recognize from the following discussion that alternative embodiments of the structures and methods illustrated herein may be employed without departing from the principles described herein.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Embodiments of the present disclosure relate to a flip flop circuit that obviates the need of a transmission gate. The flip flop includes a first match multiplexer, a second match multiplexer and a separable inverter. The first match multiplexer receives an input data signal and generates a feedback output based on the input data signal and the logic levels at two nodes coupled to the first match multiplexer. The separable inverter receives the feedback output and switches the logic level of one of two nodes but maintains the logic level per each clock cycle. The second match multiplexer generates a signal output based on the logic levels at the two nodes and the signal output that is fed back into the second match multiplexer. Embodiments may reduce power consumption and operate at lower voltages.

Example Device

Embodiments of electronic devices, user interfaces for such devices, and associated processes for using such devices are described. In some embodiments, the device is a portable communications device, such as a mobile telephone, that also contains other functions, such as PDA and/or music player functions. Exemplary embodiments of portable multifunction devices include, without limitation, the iPhone®, iPod Touch®, Apple Watch®, and iPad® devices from Apple Inc. of Cupertino, Calif. Other portable electronic devices, such as wearables, laptops or tablet computers, are, optionally, used. It should also be understood that, in some embodiments, the device is not a portable communications device, but is a desktop computer. It should further be noted that, in some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

FIG. 1 is a high-level diagram of a portable electronic device 100 in accordance with some embodiments. The device 100 optionally also includes one or more physical buttons, such as a "home" or menu button 104. The menu button 104 is, optionally, used to navigate to any application in a set of applications that are, optionally executed on the device 100. In some embodiments, the menu button 104 includes a fingerprint sensor that identifies a fingerprint on the menu button 104. The fingerprint sensor optionally is used to determine whether a finger on the menu button 104 has a fingerprint that matches a fingerprint used to unlock the device 100. Alternatively, in some embodiments, the menu button 104 is implemented as a soft key in a GUI displayed on a touch screen.

In some embodiments, the device 100 includes a touch screen 150, the menu button 104, a push button 106 for powering the device on/off and locking the device, volume adjustment button(s) 108, a Subscriber Identity Module (SIM) card slot 110, a head set jack 112, and a docking/charging external port 124. The push button 106 is, optionally, used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, the device 100 also accepts verbal input for activation or deactivation of some functions through a microphone 113. The device 100 includes various components including but not limited to a memory (which optionally includes one or more computer readable storage mediums), a memory controller, one or more processing units (CPU's), a peripherals interface, an RF circuitry, an audio circuitry, a speaker 111, a microphone 113, an input/output (I/O) subsystem, and other input or control devices. The device 100 optionally includes one or more optical sensors 164, one or more proximity sensors 166, and one or more accelerometers 168. The device 100 may include components not shown in FIG. 1.

The device 100 is only one example of a portable electronic device, and that the device 100 optionally has more or fewer components than listed above, optionally combines two or more components, or optionally has a different configuration or arrangement of the components. The various components of the device 100 listed above are implemented in hardware, software, or a combination of both hardware and software, including one or more signal processing and/or application specific integrated circuits (ASICs). An example ASIC such as an SOC is described below in conjunction with FIG. 2.

Example System On a Chip (SOC)

Figure 2:
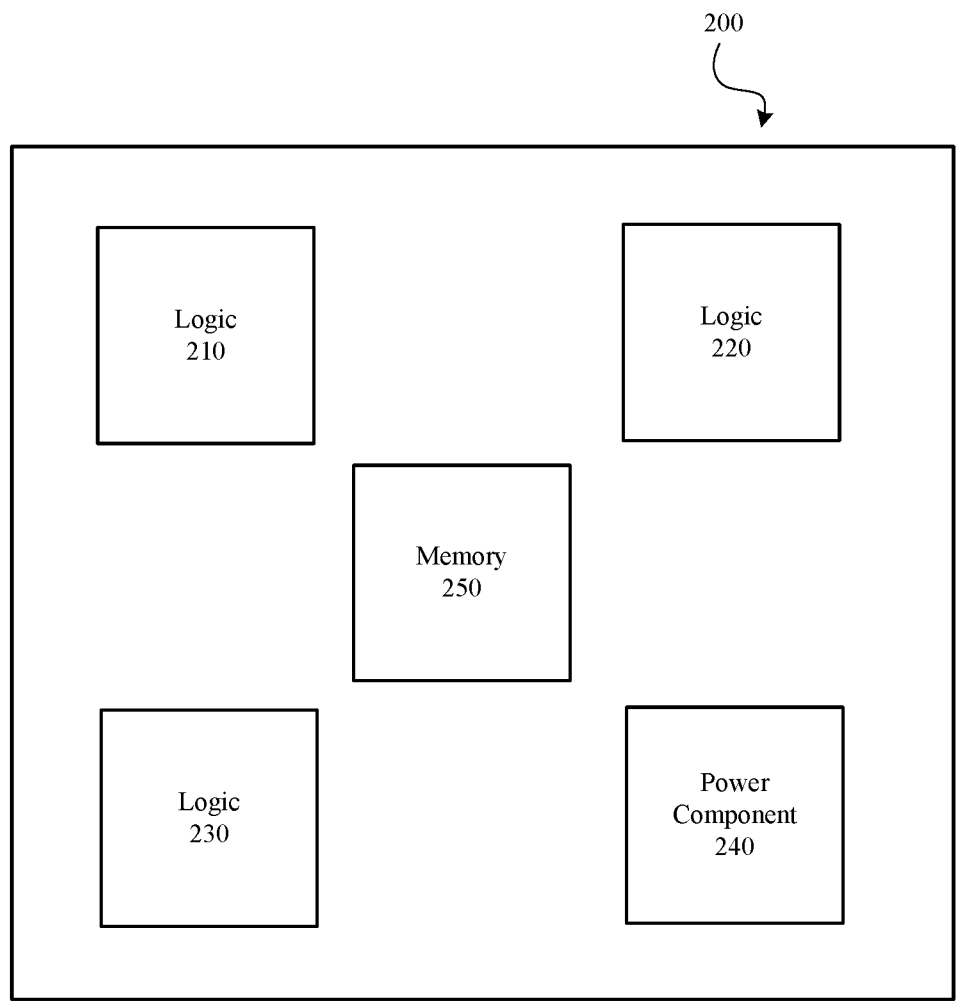
FIG. 2 is a high-level block diagram of a system on a chip (SOC), according to one embodiment.

FIG. 2 is a high-level block diagram of an SOC 200, according to one embodiment. The SOC 200 is an integrated circuit (IC) that integrates all components of a computer or other electronic system into a single chip. The SOC 200 may include digital, analog, mixed-signal, and radio-frequency (RF) functions on a single chip substrate. SOCs are common in the portable electronics market due to their low power consumption. The SOC 200 may include, among other components, one or more logic components (e.g., logic 210, logic 220, and logic 230), one or more memory components (e.g., memory 250), and one or more power components (e.g., power component 240). While FIG. 2 illustrates an SOC, this disclosure is equally applicable to other types of ASICs that may or may not include various components integrated onto a single chip.

Logic components of the SOC 200 may include one or more of microprocessors, digital signal processor (DSP), image signal processor (ISP), graphics processing unit (GPU), microcontroller, and any other processing units. For example, logic 210 is one or more processors or processing cores of a processing complex, logic 220 is a GPU, and logic 230 is an ISP. While FIG. 2 shows three logic components, it is understood that the SOC 200 may include more than or less than three logic components.

The power component 240 provides power supply voltage to various components of the SOC 200. The power component 240 typically includes multiple power domains with each power domain having a unique power supply voltage that is not shared with other power domains. For example, each logic component of the SOC 200 may be associated with its own unique power domain and hence its own unique power supply voltage. Alternatively or additionally, components within a logic component of the SOC 200 (e.g., memory and CPU within logic 210) may be associated with their own separate and unique power domains. In some embodiments, power component 240 may correspond to one or more voltage regulators for each power domain. Although power component 240 is shown in FIG. 2 as being integrated on SOC 200, in some embodiments, power component 240 may be external from SOC 200.

The memory 250 may include random access memory (RAM) and non-volatile memory such as magnetic disk storage devices and flash memory devices.

Representative Operation and Structure of Master-Slave Flip Flop

A typical master-slave flip flop is implemented with a master latch and a slave latch. A clock signal controls the feedback paths and forward paths in both the master and slave latches. During the negative phase of a clock, the forward path of the master latch and feedback path of the slave latch is enabled while the feedback path of the master latch and forward path of the slave latch are disabled. During the positive phase of the clock, the feedback path of the master latch and forward path of the slave latch is enabled while the forward path of the master latch and feedback path of the slave latch are disabled.

In such master-slave flip flops, a transmission gate is generally provided at the output of the master latch and input of the slave latch. A transmission gate is an electronic element that will block or pass a signal from the input to the output. For example, during the positive phase of the clock at which the forward path of the slave latch is enabled, the transmission gate allows data from the output of the master latch to propagate to the input and to the output of the slave latch. During the negative phase of the clock at which the forward path of the slave latch is blocked, the transmission gate blocks data from the output of the master latch to pass to the input of the slave latch.

Issues with contention may occur by the operation of the transmission gate. Contention occurs when more than one element in a circuit operates to control a node in different directions at the same time. For example, contention occurs through the transmission gate when both the forward path of the master latch and feedback path of the slave latch operate to drive the input to the slave latch at the same time. Such contention may occur, for example, during the switching from a negative phase to a positive phase of the clock.

Issues with charge sharing may also occur with the transmission gate. Charge sharing is a problem that occurs when charge stored at a node is redistributed among other capacitors that are connected to the node. Other capacitors may be junction capacitances of transistors. In a typical flip flop, a capacitor exists at the input of the slave latch. This capacitor may be connected to the output of the master latch or the feedback path of the slave latch. For example, the capacitor may be charged to a high logic level from the feedback path. Thus, charge stored on the capacitor can be distributed to other capacitors (i.e., junction capacitances of connected transistors) located in the master latch and the value at the input node of the slave may become corrupted.

With charge sharing issues, the flip flop needs to operate at higher voltages. When lower voltages are used, corruption is more likely to occur due to charge sharing and compromised behavior of the flip flop.

Example Structure of Flip Flop without Transmission Gate

Figure 3:
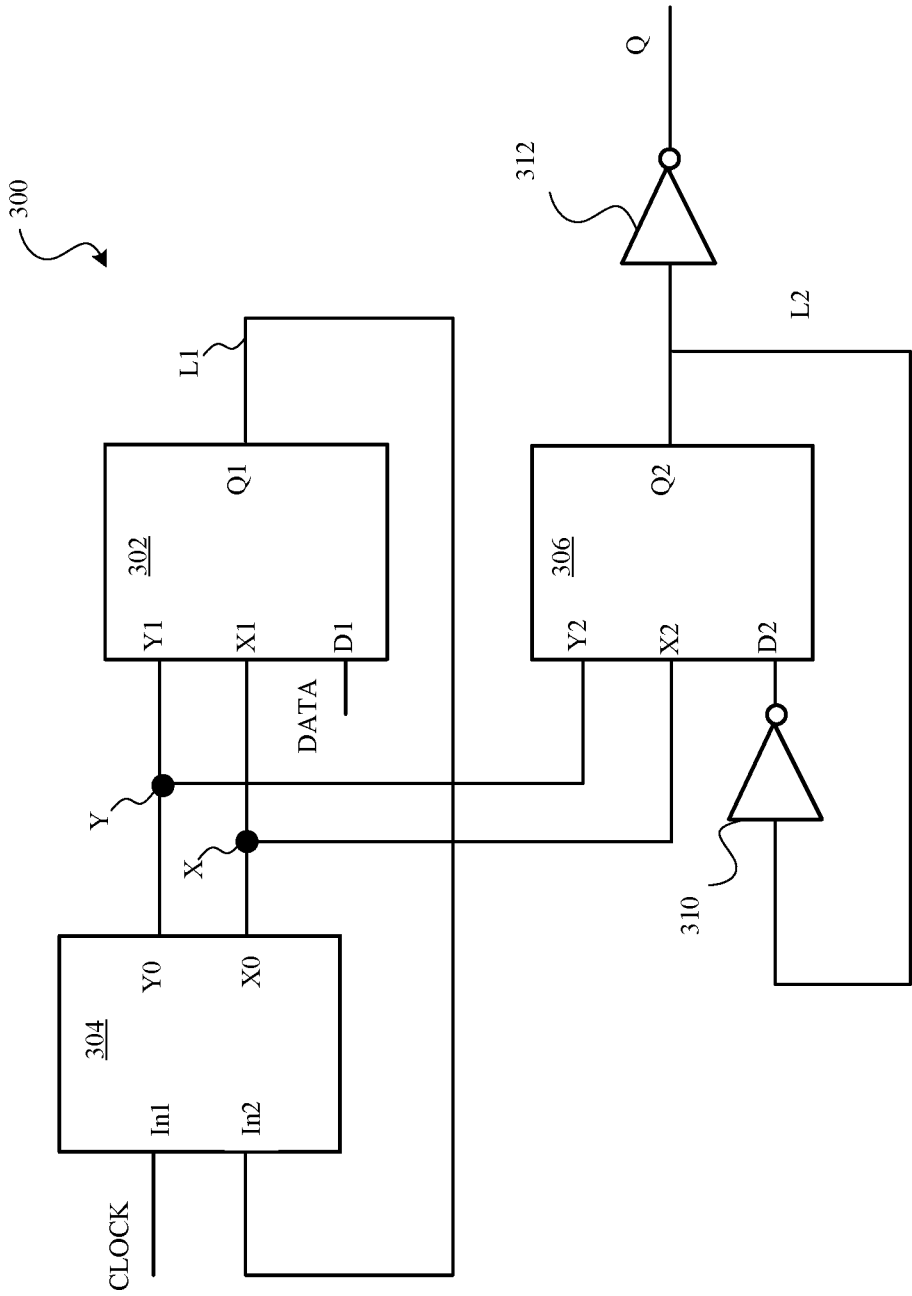
FIG. 3 is a block diagram of a flip flop circuit including two match multiplexers and a separable inverter, according to one embodiment.

For at least these reasons, it is advantageous to implement a flip flop without using a transmission gate. FIG. 3 is a block diagram of a flip flop circuit 300 including two match multiplexers and a separable inverter, according to one embodiment. The flip flop circuit 300 may include a match multiplexer 302, match multiplexer 306, separable inverter 304, inverter 310 and inverter 312. The flip flop circuit 300 receives a control input signal CLOCK, a data input signal DATA and sets an output signal Q. The logic operation of generating the output signal Q at the flip flop circuit 300 based on CLOCK and DATA is the same as a typical master-slave flip flop circuit although the operation of internal circuits of the flip flop circuit 300 is different from the typical master-slave flip flop, as described below in detail.

The match multiplexer 302 is a circuit that generates a feedback signal at its output terminal Q1 based on the logic levels of two nodes Y and X (connected to its input terminals Y1 and X1) and an input data signal DATA (received at its input terminal D1). Specifically, if the logic levels at input terminals Y1 and X1 are at the identical logic level (i.e., logic high "1" or logic low "0"), the signal at output terminal Q1 of the match multiplexer 302 is set to the inverse of the logic level at input terminal X1 whereas if the signal at input terminals Y1 and X1 are different logic levels, the signal at output terminal Q1 is set to the inverse of signal received at input terminal D1, as described below in detail with reference to FIGS. 6A and 6B.

The separable inverter 304 is a circuit that generates a pair of control signals at its output terminals Y0 and X0 (connected to two nodes Y and X) based on the logic levels of CLOCK (connected to its input terminal In1) and a feedback signal generated at output terminal Q1 of match multiplexer 302 (connected to its input terminal In2 through feedback line L1). Specifically, if CLOCK is at a high logic level, the control signals at output terminals Y0 and X0 of the separable inverter 304 are set to the inverse of the logic level of a feedback signal $V_{L1}$ generated at output terminal Q1 and carried through the feedback line L1 whereas if CLOCK is at a low logic level, the control signal at output terminal Y0 is set to a high logic level and the control signal at output terminal X0 is set to a low logic level, as described below in detail with reference to FIGS. 5A through 5C.

Match multiplexer 306 is a circuit that generates a feedback signal at its output terminal Q2 based on the logic levels of two nodes Y and X (connected to its input terminals Y2 and X2) and the feedback signal generated at output terminal Q2 (coupled to its input terminal D2 through feedback line L2). The output terminal Q2 is connected to the input of inverter 310 and the output of inverter 310 is connected to the input terminal D2. Match multiplexer 306 may have the same circuit components as match multiplexer 302 and is operationally equivalent to match multiplexer 302. Specifically, if nodes Y and X are at the identical logic level (i.e., logic high "1" or logic low "0"), the feedback signal generated at output terminal Q2 of the match multiplexer 306 is the inverse of the logic level at input terminal X2 whereas if the logic level at input terminals Y2 and X2 are different logic levels, the feedback signal generated at output terminal Q2 is the inverse of the logic level at input terminal D2 (signal generated at Q2 maintains same logical value), as described below in detail with reference to FIGS. 6A and 6B. The output terminal Q2 is connected to the input of inverter 312 and the output of inverter 312 is the output signal Q of the flip flop 300.

Figure 4:
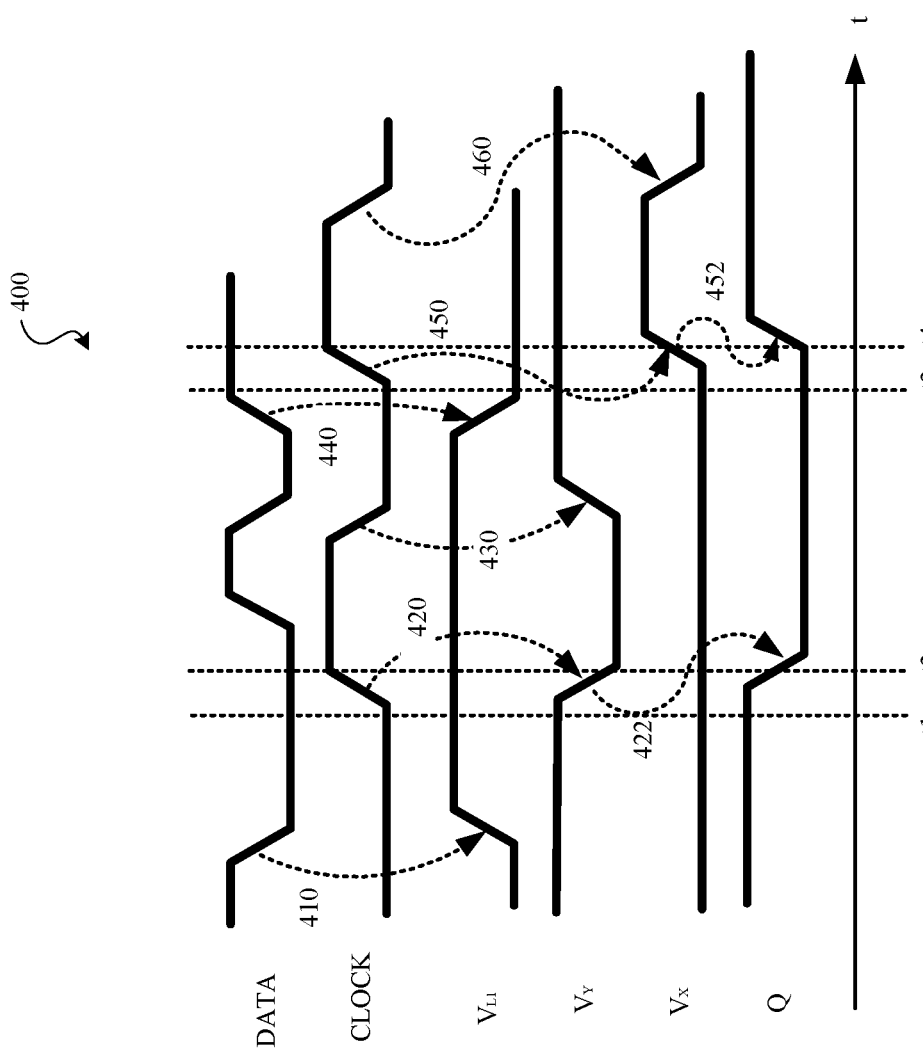
FIG. 4 is a timing diagram illustrating an operation of the flip flop of FIG. 3, according to one embodiment.

FIG. 4 is a timing diagram illustrating an operation of the flip flop of FIG. 3, according to one embodiment. In FIG. 4, a horizontal axis represents time (t) and a vertical axis (although not explicitly shown) represents voltage of various signals. Various points in time, t1 through t4, are represented by vertical dotted lines. FIG. 4 shows DATA, CLOCK, voltage $V_{L1}$ at node Q1 (also at the feedback path L1 and terminal In2), voltage $V_Y$ at node Y (and terminals Y0, Y1 and Y2), voltage $V_X$ at node X (and terminals X0, X1 and X2), and output signal Q. The time period between points t1 and t3 represent one period of CLOCK.

As shown in FIG. 4, the voltage $V_Y$ is initially at a high logic level and the voltage $V_X$ is at a low logic level. Because the logic levels at input terminals X1 and Y1 are different, the output terminal Q1 of the match multiplexer 302 is set to an inverse of voltage level at input terminal D1 (DATA). Because DATA is initially at a high logic level in FIG. 4, the output terminal Q1 is set to a low logic value (as shown by $V_{L1}$ at low logic level). Because CLOCK initially received at the input terminal In1 of the separable inverter 304 is at a low logic level, the separable inverter 304 maintains Vx at a low logic level and $V_Y$ at a high logic level. The match multiplexer 306 operates in a similar way as the match multiplexer 302, and therefore, the voltage level at output terminal Q2 is set to an inverse of the voltage level at input terminal D2. Because the voltage level at Q is initially high as shown in FIG. 4, voltage $V_{L2}$ is at a low logic level, and the voltage at the input terminal D2, as inverted by the inverter 310, is at a high logic level. Because the voltage level at output terminal Q2 is the inverse of voltage level at input terminal D2 (high logic level), the voltage level at output terminal Q2 maintains a low logic level. The logic levels at nodes X and Y, the states of the separable inverter 304 and the match multiplexer 306 are maintained until DATA signal changes as indicated by arrow 410.

When DATA drops to a low logic level as indicated by arrow 410, the match multiplexer 302 changes $V_{L1}$ at its output terminal Q1 to a high logic level (because VL1 has a voltage level inverse of DATA). Voltages $V_Y$ and $V_X$ are at still at different logic levels, and therefore, the match multiplexer 302 generates an output voltage Q1 that is at a high logic level (i.e., inverse of DATA voltage level). This in turn, raises the voltage at input terminal In2 of the separable inverter 304 to a high logic level. However, CLOCK is still at a low logic level, and therefore, the voltage levels at nodes X and Y are maintained. Consequently, the voltage levels at input terminals X2, Y2 for the match multiplexer 306 remain unchanged, and the output of the match multiplexer 306 also remains unchanged.

When CLOCK rises to a high logic level between time t1 and t2 as indicated by arrow 420, voltage $V_Y$ at node Y drops to a low logic level as indicated by arrow 420 because the separable inverter 304 sets voltage $V_Y$ at its output terminal Y0 to the inverse of high logic level of voltage $V_{L1}$ received at its input terminal In2. However, voltage Vx remains unchanged in a low logic level because the low logic level is the inverse of voltage level of the inverse of the high logic level of a feedback signal $V_{L1}$. The change in voltage $V_Y$ in turn causes the output voltage at terminal Q2 of the match multiplexer 306 to change. Specifically, because voltage $V_Y$ and $V_X$ are now at the same low logic level, the output signal at output terminal Q2 rises to a high logic level because the feedback signal generated at output terminal Q2 of the match multiplexer 306 is the inverse of the low logic level at input terminal X2. Therefore, output Q, as inverted by the inverter 312, turns to a low logic level as indicated by arrow 422.

When the logic level of CLOCK drops to a low logic level as indicated by the arrow 430, the separable inverter 304 changes the voltage $V_Y$ at output terminal Y0 to a high logic level. Voltage Vx, on the other hand, maintains the low logic level because voltage Vx is set to the inverse of the high logic level of a feedback signal $V_{L1}$. Because the logic levels at input terminals Y2 and X2 are different (i.e., $V_Y$ is at a high logic level and Vx is at a low logic level), the feedback signal generated at output terminal Q2 maintains a high logic state (i.e., the inverse of the logic level at input terminal D2) and the output Q, as inverted by the inverter 312, maintains a low logic level.

When DATA rises to a high logic level as indicated by arrow 440 while CLOCK is at a low logic level, match multiplexer 302 sets voltage $V_{L1}$ at its output terminal Q1 to the inverse of DATA received at its input terminal D1. As a result, the voltage $V_{L1}$ turns to a low logic level which is the inverse of DATA signal (high logic level) when CLOCK is at a low logic level. Although the voltage at input terminal In2 of the separable inverter 304 is changed to the low logic level, the control signal at output terminal Y0 (and $V_Y$) remains at a high logic level and the control signal at output terminal X0 (and $V_X$) is set to a low logic level because CLOCK is at a low logic level. Because there is no change in the voltage levels of Vx and $V_Y$, the state of match multiplexer 306 and its output remains the same.

When CLOCK rises to a high logic level between time t3 and t4 as indicated by arrow 450, the separable inverter 304 sets voltage Vx and voltage $V_Y$ to the inverse of the feedback signal $V_{L1}$. Feedback signal $V_{L1}$ was previously turned to a low logic state by switching of the DATA (as indicated by arrow 440). Therefore, voltage Vx turns to a high logic level while voltage $V_Y$ retains the current high logic level (changed previously as indicated by arrow 430).

When voltage $V_X$ turns to a high voltage level, the output signal Q rises to a high logic level as indicated by arrow 452 because the match multiplexer 306 sets the voltage at its output terminal Q2 to the logical inverse of voltage $V_Y$ and $V_X$, and inverter 312 inverts the voltage at output terminal Q2.

Subsequently, when CLOCK turns to a low logic level as indicated by arrow 460 while the feedback signal $V_{L1}$ is in a low logic level, the separable inverter 304 sets the voltage $V_X$ at output terminal X0 to a low logic level but maintains a high logic level of voltage $V_Y$. Because the logic levels of voltage $V_X$ and voltage $V_Y$ now differ, the $V_{L1}$ signal at output terminal Q1 remains at a low logic level (because $V_{L1}$ is set to the inverse of DATA, which is in a high logic level) and the voltage at Q2 remains at a low logic level (because the voltage at output terminal Q2 is the inverse of the logic level at input terminal D2, which is a low logic level).

The operation of the flip flop circuit 300 as described above with reference to FIG. 4 is merely illustrative. Various modifications or changes may be made to the operation of the flip flop circuit 300. For example, the logic level of DATA, CLOCK or both may be reversed relative to the operating example illustrated in FIG. 4.

Example Structure of Separable Inverter

Figure 5A:
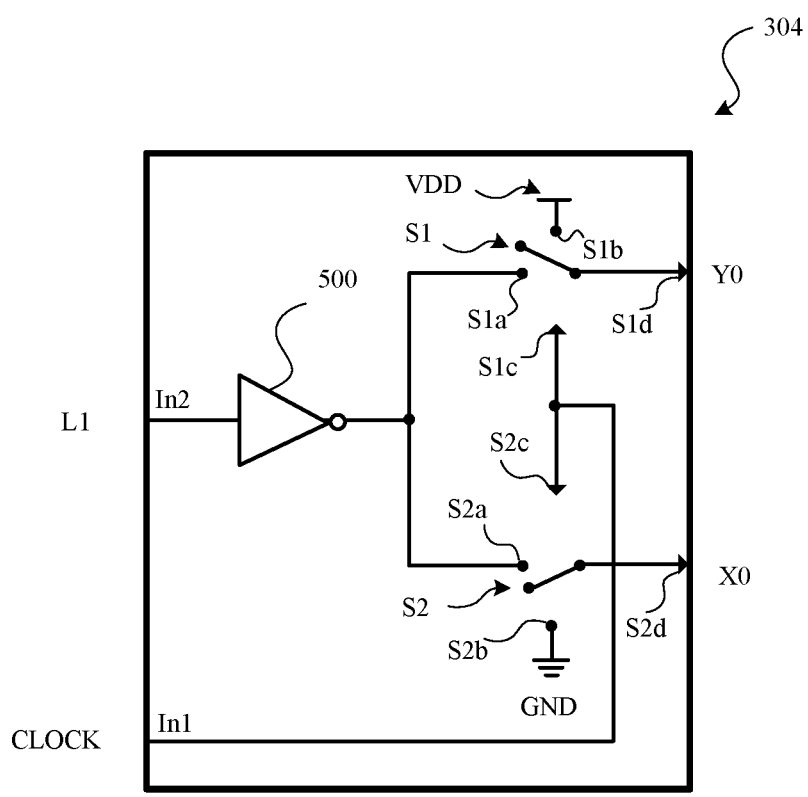
FIG. 5A is a conceptual diagram describing the behavioral model of the separable inverter of FIG. 3, according to one embodiment.

FIG. 5A is a conceptual diagram describing the behavioral model of the separable inverter 304 of FIG. 3. The separable inverter 304 receives CLOCK at its input terminal In1, a feedback signal $V_{L1}$ at its input terminal In2, and controls voltages $V_Y$ and $V_X$ at nodes Y and X output signal connected to its output terminals Y0 and X0.

In one embodiment, when the input In1 is at a high logic level, the voltage levels at outputs Y0 and X0 are set to the logical inverse of the voltage level at input terminal In2, and when the input terminal In1 is at a low logic level, the output Y0 is set to a high logic level and the output X0 is set to a low logic level. Example inputs and outputs of separable inverter 304 are described in below Table 1 (where "H" indicates a high voltage level and "L" indicates a low voltage level).

TABLE 1

| In1 | In2 | Y0 | X0 |
| --- | --- | --- | --- |
| L | L | H | L |
| L | H | H | L |
| H | L | H | H |
| H | H | L | L |

In the embodiment of FIG. 5A, the separable inverter 304 includes an inverter 500, a switch S1 and a switch S2. The input terminal In1 of the separable inverter 304 is connected to the control terminal S1c of switch S1 and the control terminal S2c of switch S2. The In2 input terminal of the separable inverter 304 is connected to the input of the inverter 500. The output of the inverter 500 is connected to terminal S1a of switch S1 and S2a terminal of switch S2. The S1b terminal of switch S1 is connected to a high reference voltage VDD and the S2b terminal of switch S2 is connected to a low reference voltage GND. The Y0 output of the separable inverter 304 is connected to the terminal S1d of switch S1, and the X0 output of the separable inverter 304 is connected to the terminal S2d of switch S2.

The switch S1 connects the output terminal Y0 to terminal S1a or terminal S1b depending on the logic level of terminal S1c. The switch S2 connects the output X0 to terminal S2a or terminal S2b depending on the logic level of control terminal S2c. Specifically, when input node In1 is at a high logic level, the switch S1 and switch S2 connect the output terminals Y0 and X0 to the inverse of the signal at input terminal In2. When In1 is at a low logic level, the switch S1 connects the output Y0 to VDD, and the switch S2 connects the output X0 to GND.

Figure 5B:
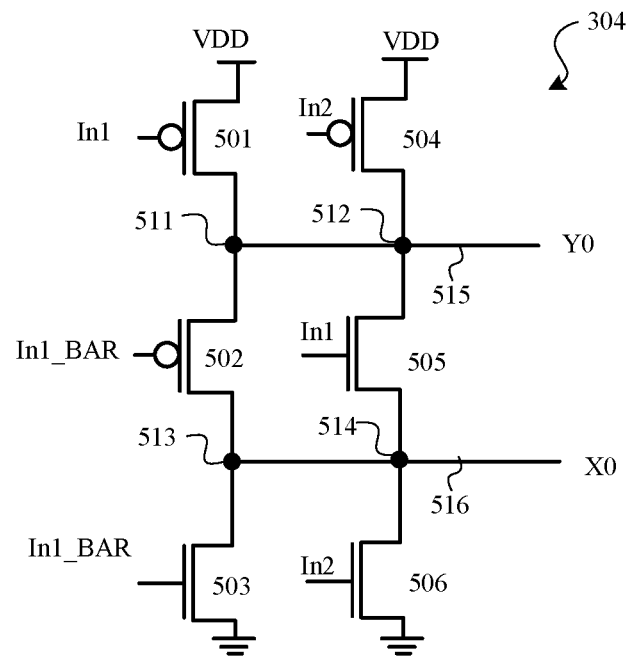
FIG. 5B is a circuit diagram of the separable inverter of FIG. 3, according to one embodiment.

FIG. 5B is a circuit diagram of the separable inverter 304 of FIG. 3, according to one embodiment. In the embodiment of FIG. 5B, the separable inverter 304 includes three PFETs that control a logic level of at least one of the pair of output terminals Y0 and X0 according to the logic levels at the input terminals In1 and In2, and three NFETs to control the logic level of at least one of the pair of output terminals Y0 and X0 according to the logic levels at the input terminals In1 and In2.

Specifically, the separable inverter 304 includes a first string of transistors PFET 501, PFET 502, and NFET 503; and a second string of transistors PFET 504, NFET 505, and NFET 506. The first string of transistors and second string of transistors are connected to a high reference voltage VDD through the source of PFET 501 and the source of PFET 504, and a low reference voltage GND through the source of NFET 503 and the source of NFET 506. The drain of PFET 501 is connected to the source of PFET 502, the drain of PFET 502 is connected to the drain of NFET 503. The drain of PFET 504 is connected to the drain of NFET 505, the source of NFET 505 is connected to the drain of NFET 506.

Input terminal In1 is connected to the gate of PFET 501 and the gate of PFET 505. Input terminal In2 is connected to the gate of PFET 504 and the gate of NFET 506. The input signal In1_BAR (logical inverse of the input signal at In1) is received at the gate of PFET 502 and the gate of NFET 503.

The output terminal Y0 is connected to node 511 (between the drain of PFET 501 and the source of PFET 502) and node 512 (between the drain of PFET 504 and the drain of NFET 505) via connection line 515. The output terminal X0 is connected to node 513 (between the drain of PFET 502 and the drain of NFET 503) and node 514 (between the source of NFET 505 and the drain of NFET 506) via connection line 516.

When the input terminal In1 is at a high logic level, PFET 502 and NFET 505 are turned on while PFET 501 and NFET 503 of the first transistor string are turned off. As a result, the output terminals Y0 and X0 have the same voltage level as set by the transistors 504 and 506 that collectively act as an inverter. Specifically, the voltage levels of the output terminal Y0 and X0 are set by the transistors 504 and 506 to the logical inverse of voltage at the input In2. When voltage at the input terminal In2 is at a high logic level, NFET 506 is turned on and PFET 504 is turned off, setting the output terminal Y0 and X0 to a low logic level. When the voltage at input In2 is at a low logic level, PFET 504 is turned on and NFET 506 is turned off, setting the output terminal Y0 and X0 to a high logic level.

Conversely, when the voltage at input terminal In1 is at a low logic level, PFET 502 and NFET 505 are turned off, decoupling the output terminals Y0 and X0. Also, PFET 501 and NFET 503 are turned on, setting output terminal Y0 to a high logic level and output terminal X0 to a low logic level.

Figure 5C:
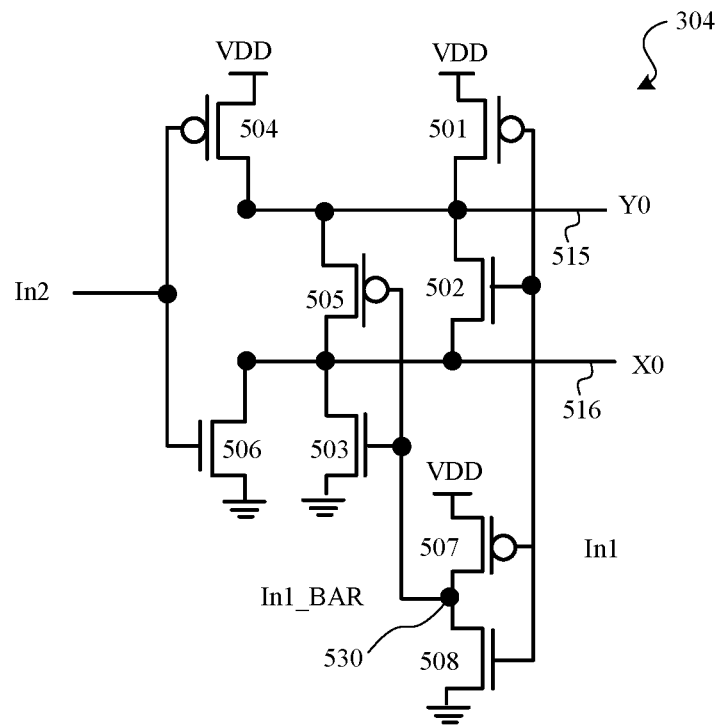
FIG. 5C is a circuit diagram of the separable inverter of FIG. 3, according to one embodiment.

FIG. 5C is a circuit diagram of the separable inverter of FIG. 3, according to another embodiment. The embodiment of FIG. 5C is substantially the same as the circuit of FIG. 5B (and hence the same labels are used for corresponding transistors in FIGS. 5B and 5C) except that the separable inverter 304 of FIG. 5C further includes PFET 507 and NFET 508 to create the signal In1_BAR. The source of PFET 507 is connected to a high voltage terminal and the source of NFET 508 is connected to the low voltage terminal.

Node 530 is connected to the drain of PFET 507 and the drain of NFET 508 and connected to the gate of PFET 505 and the gate of NFET 503. Input terminal In1 is connected to the gate of PFET 507 and the gate of NFET 508. When the signal at input terminal In1 is at a high logic level, the voltage at node 530 is a logical low because PFET 507 is turned off. As a result, node 530 is disconnected from high reference voltage VDD. NFET 508 is turned on at this time, connecting node 530 to low reference voltage GND. When the signal at input terminal In1 is at a low logic level, the voltage at node 530 is a high logic level because PFET 507 is turned on, connecting node 530 to the high voltage terminal and NFET 508 is turned off, disconnecting node 530 to the low voltage terminal. Thus, the voltage at node 530 is the inverse of In1, the signal In1_BAR.

The arrangements of PFETs and NFETs for the separable inverter 304 in FIGS. 5A and 5B are merely illustrative. Different combinations of PFETs and NFETs may be used in different combinations to obtain the same or similar functionality of the separable inverter 304 in FIGS. 5A and 5B.

Example Match Multiplexer

The match multiplexer 302/306 receives signals at input terminals Y1/Y2, X1/X2 and D1/D2 and provides an output signal at its output terminal Q1/Q2 according to the voltage levels at input terminals Y1/Y2, X1/X2 and D1/D2. Match multiplexer 302/306 receives signals from output terminals Y0 and X0 of the separable inverter 304.

Specifically, when the voltage at input terminals Y1/Y2 and X1/X2 are not at the same logic level, the output terminal Q1/Q2 is set to the logical inverse of the signal at input terminal D1/D2. When the voltage at input terminals Y1/Y2 and X1/X2 are at the same logic level, the output terminal Q1/Q2 is set to the logical inverse of the voltage at input terminal Y1/Y2 and X1/X2. Example inputs and outputs of match multiplexer 302/306 are described in below Table 2 (where "H" indicates a high voltage level, "L" indicates a low voltage level).

TABLE 2

| Y1/Y2 | X1/X2 | D1/D2 | Q1/Q2 |
|-------|-------|-------|-------|
| H | L | H | L |
| H | L | L | H |
| L | L | H or L | H |
| H | H | H or L | L |

Figure 6A:
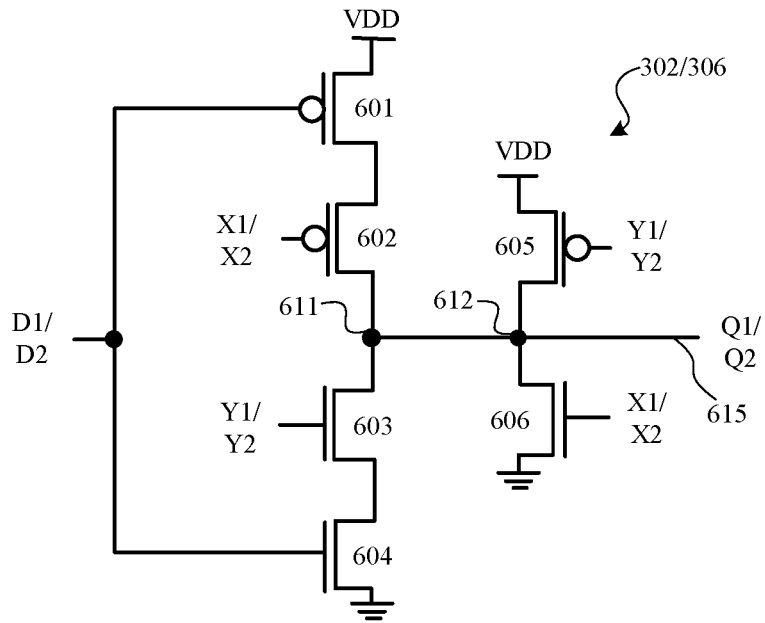
FIG. 6A is a circuit diagram of a match multiplexer of FIG. 3, according to one embodiment.

FIG. 6A is a circuit diagram of a match multiplexer 302/306 of FIG. 3, according to one embodiment. In the embodiment of FIG. 6A, the match multiplexer 302/306 includes a first string of transistors PFET 601, PFET 602, NFET 603, and NFET 604; and a second string of transistors PFET 605 and NFET 606. The drain of PFET 601 is connected to the source of PFET 602, the drain of PFET 602 is connected to the drain of NFET 603, and the source of NFET 603 is connected to the drain of NFET 604. The drain of PFET 605 is connected to the drain of NFET 606. The first string of transistors and the second string of transistors are connected to a high reference voltage VDD through the source of PFET 601 and the source of PFET 605, respectively. Both strings of transistors are connected to a low reference voltage GND through the source of NFET 604 and the source of NFET 606.

The input terminal X1/X2 is connected to the gate of PFET 602 and the gate of NFET 606. The input terminal Y1/Y2 is connected to the gate of NFET 603 and the gate of PFET 605. The input terminal D1/D2 is connected to the gate of PFET 601 and the gate of NFET 604. Node 611 is connected to the drain of PFET 602 and the drain of NFET 603. Node 612 is connected to the drain of PFET 605 and drain of NFET 606. The output terminal Q1/Q2 is connected to node 611 and node 612 through connection line 615.

When the voltage at input terminal Y1/Y2 is at a high logic level and the voltage at input terminal X1/X2 is at a low logic level, PFET 602 and NFET 603 are turned on, enabling the a first string of transistors 601, 602, 603, 604 to determine the logical value at output terminal Q1/Q2 while PFET 605 and NFET 606 are turned off. When the voltage at input terminal D1/D2 is at a high logic level, output terminal Q1/Q2 is connected to the low voltage terminal through NFET 604 being turned on, and disconnected to the low voltage terminal through PFET 601 being turned off.

When the voltage at input terminal D1/D2 is at a low logic level, output terminal Q1/Q2 is connected to the high reference voltage VDD because PFET 601 is turned on and disconnected from the low reference voltage GND because NFET 604 is turned off. Thus, the voltage at output terminal Q1/Q2 is the inverse of the logic level at input terminal D1/D2 when the voltage at input terminal X1/X2 is at a low logic level and the voltage at input terminal Y1/Y2 is at a high logic level.

When the voltage at input terminal Y1/Y2 and input terminal X1/X2 are at the same logic level, gates of PFET 602, NFET 603, PFET 605, and PFET 606 are all placed at the same logic level, enabling the second string of transistors 605, 606 to determine the logical value at output terminal Q1/Q2. When the voltage at input terminal Y1/Y2 and input terminal X1/X2 is at a low logic level, PFET 605 is turned on, connecting the high reference voltage VDD to output terminal Q1/Q2. Conversely, NFET 606 and NFET 603 are also turned off at this time, disconnecting output terminal Q1/Q2 to the low reference voltage GND.

When the voltage at input terminal Y1/Y2 and input terminal X1/X2 is at a high logic level, NFET 606 is turned on, connecting the low reference voltage GND to output terminal Q1/Q2. Conversely, PFET 602 and PFET 605 are turned off at this time, disconnecting the high reference voltage VDD from the output terminal Q1/Q2.

Thus, the voltage at output terminal Q1/Q2 is the inverse logic level of the voltage at input terminal Y1/Y2 and input terminal X1/X2 when the voltage at input terminal X1/X2 and the voltage at input terminal Y1/Y2 are at the same logic level.

Figure 6B:
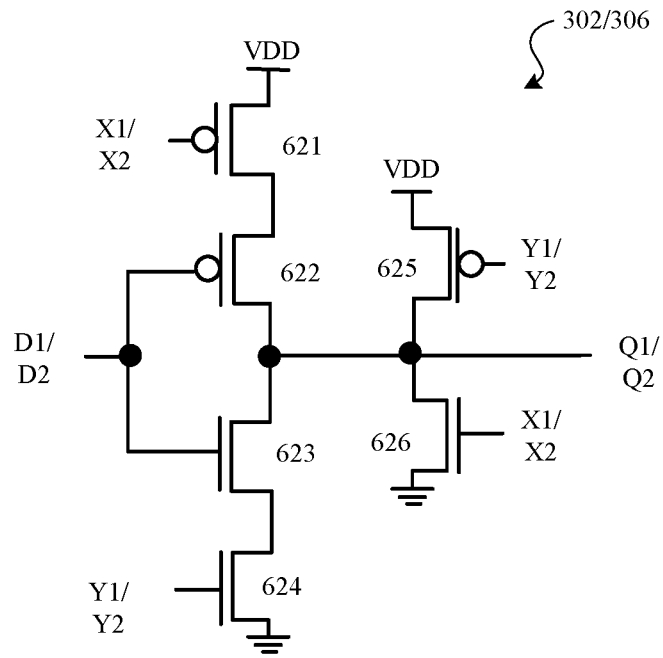
FIG. 6B is a circuit diagram of a match multiplexer of FIG. 3, according to one embodiment.

FIG. 6B is a circuit diagram of a match multiplexer of FIG. 3, according to one embodiment. The embodiment of FIG. 6B is substantially the same as the embodiment of FIG. 6A except for the connections of the input terminals D1/D2, Y1/Y2, and X1/X2 to the gates of the transistors in the first string of transistors. The circuit of FIG. 6B includes PFET 621, PFET 622, NFET 623, NFET 624, PFET 625 and NFET 626 which correspond to PFET 601, PFET 602, NFET 603, NFET 604, PFET 605 and NFET 606, respectively, except for the difference in following connections: (i) the D1/D2 input is supplied to the gate of PMOS 622 and the gate of NMOS 623 instead of the gate of PMOS 601 and the gate of NMOS 604; (ii) the input terminal X1/X2 is supplied to the gate of PMOS 621 instead of the gate of PMOS 602; and (iii) the input terminal Y1/Y2 is supplied to the gate of NMOS 624 instead of the gate of NMOS 603.

The operation of the circuit in FIG. 6B is the same as the circuit of FIG. 6A except that the specific NMOS or PMOS transistor that control the output terminal Q1/Q2 from the first string of transistors are different. For example, when the voltage at input terminals Y1/Y2 is at a high logic level and the voltage at input terminals X1/X2 is at a low logic level, PFET 621 and NFET 624 are turned on (instead of PFET 602 and NFET 603), allowing the voltage at input terminal D1/D2 to determine the value at output terminal Q1/Q2 by controlling the behavior of PFET 622 and NFET 623 (instead of PFET 601 and NFET 604). When the voltage at input terminal D1/D2 is at a high logic level, output terminal Q1/Q2 is connected to the low voltage terminal through NFET 623 being turned on, and disconnected to the high voltage terminal through PFET 622 being turned off. When the voltage at input terminal D1/D2 is at a low logic level, output terminal Q1/Q2 is connected to the high voltage terminal through PFET 622 being turned on and disconnected from the low voltage terminal through NFET 623 being turned off. The overall behavior of the circuit in FIG. 6B is the same as the circuit in FIG. 6A, and therefore, the detailed its explanation is omitted herein for the sake of brevity.

Figure 7:
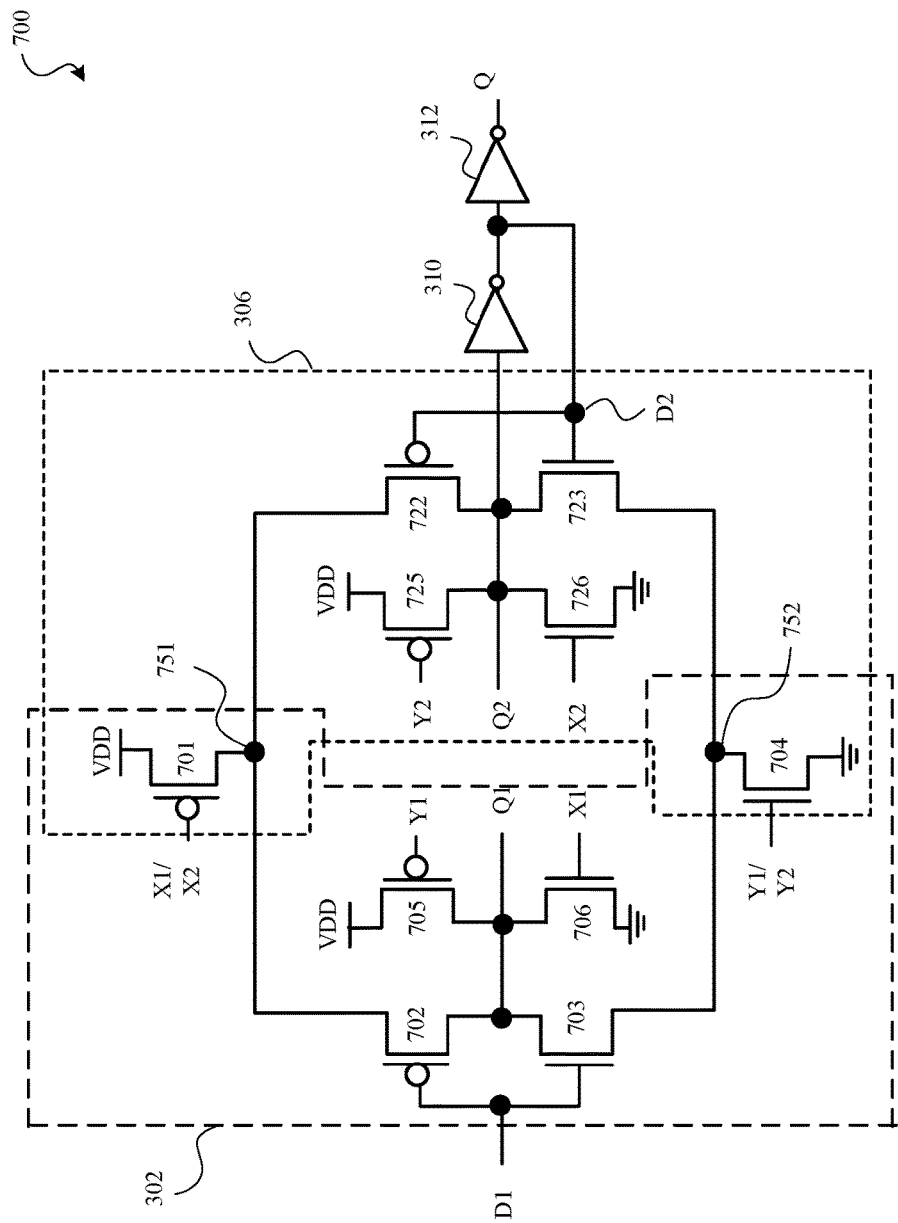
FIG. 7 is a circuit diagram of two match multiplexers of FIG. 3, according to one embodiment.

FIG. 7 is a circuit diagram of two match multiplexers 302/306 of FIG. 3 sharing certain components, according to one embodiment. By sharing components in two match multiplexers, the overall number of transistors in the flip flop can be advantageously reduced. In FIG. 7, the embodiment of match multiplexer 302 and a match multiplexer 306 is the same as the embodiment of FIG. 6B except that two transistors in the first string of transistors are shared between match multiplexer 302 and match multiplexer 306.

In the embodiment of FIG. 7, the match multiplexer 302 includes PFET 701, PFET 702, NFET 703, NFET 704, PFET 705 and NFET 706 and the match multiplexer 306 includes PFET 701, PFET 722, NFET 723, NFET 704, PFET 725 and NFET 726 which are the same as PFET 621, PFET 622, NFET 623, NFET 624, PFET 625 and NFET 626 of FIG. 6B except that PFET 701 and NFET 704 are shared between match multiplexer 302 and match multiplexer 306. Node 751 is connected to the drain of PFET 701, the source of PFET 702, and the source of PFET 722. Node 752 is connected to the drain of NFET 704 and source of NFET 703 and source of NFET 723.

Otherwise the structure and operation of the embodiment of FIG. 7 are the same as those of the embodiment of FIG. 6B, and therefore, detailed description thereof is omitted herein for the sake of brevity.

Example Scan Mode Operation

Figure 8:
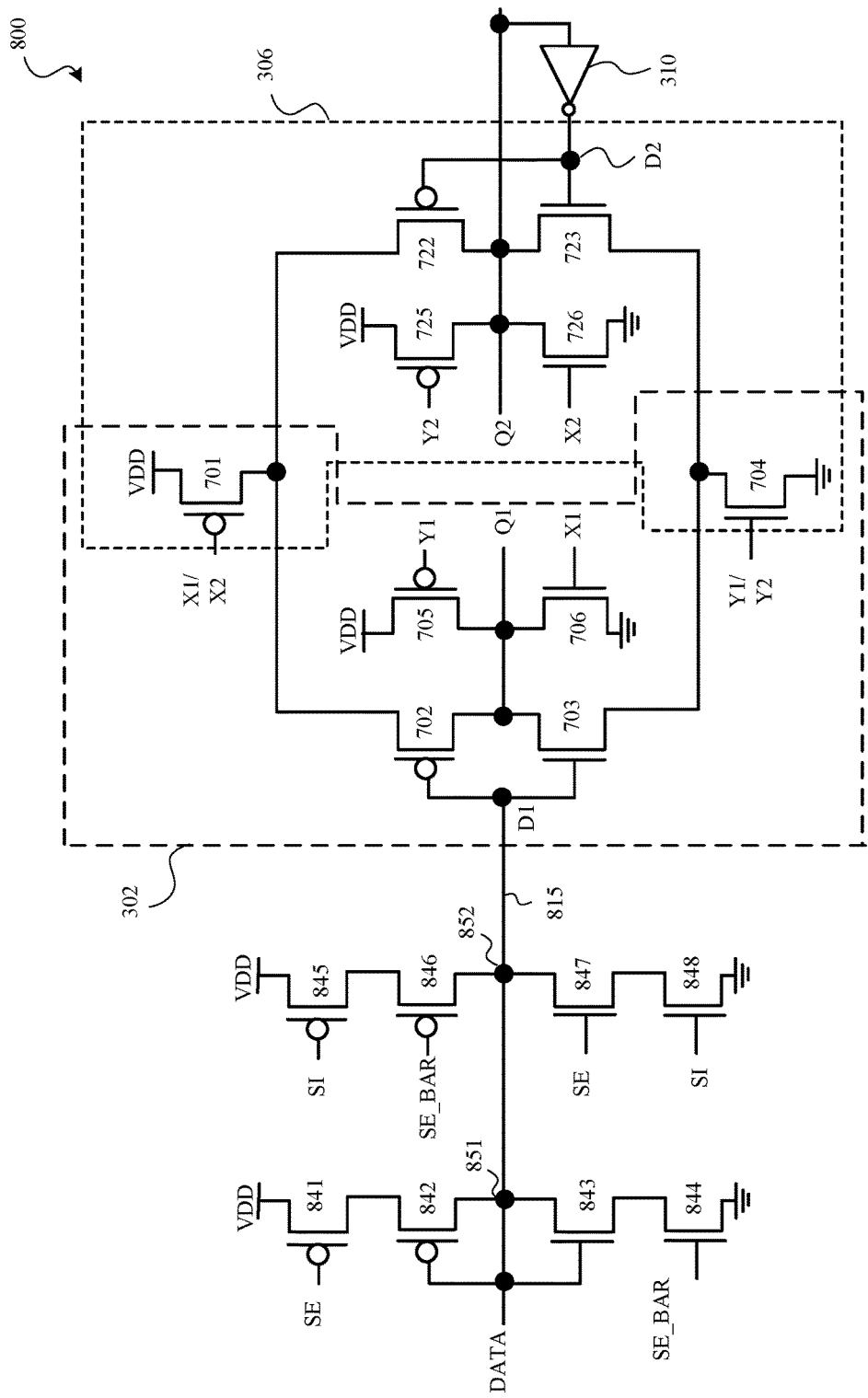
FIG. 8 is a circuit diagram of two match multiplexers with a scan mode, according to one embodiment.

FIG. 8 is a circuit diagram of two match multiplexers 302/306 operable in a scan mode, according to one embodiment. The embodiment of FIG. 8 includes the two match multiplexers 302/306 of FIG. 7 and a scan enable circuit whose output is connected to the input terminal D1 of the match multiplexer 302. The embodiment of FIG. 8 also includes inverter 310 that is the same components as shown in FIG. 3, and therefore, a description of inverter 310 is omitted herein for the sake of brevity.

In the embodiment of FIG. 8, a scan enable circuit includes a first string of transistors PFET 841, PFET 842, NFET 843, NFET 844; and a second string of transistors PFET 845, PFET 846, NFET 847, NFET 848. The drain of PFET 841 is connected to the source of PFET 842, the drain of PFET 842 is connected to the drain of NFET 843, the source of NFET 843 is connected to the drain of NFET 844. The drain of PFET 845 is connected to the source of PFET 846, the drain of PFET 846 is connected to the drain of NFET 847, the source of NFET 847 is connected to the drain of NFET 848.

The first string of transistors and the second string of transistors are connected to the high reference voltage VDD through the source of PFET 841 and the source of PFET 845, and the low reference voltage GND through the source of NFET 844 and the source of NFET 848. Node 851 is connected to the drain of PFET 842 and the drain of NFET 843. Node 852 is connected to the drain of PFET 846 and drain of NFET 847. The input terminal D1 is connected to node 851 and node 852 through connection line 815. A scan enable signal SE is received at the gates of PFET 841 and NFET 847. DATA is received at the gate of PFET 842 and NFET 843. An inverted scan enable signal SE_BAR is received at the gate of NFET 844 and the gate of PFET 846. A scan input signal SI is received at the gate of PFET 845 and the gate of NFET 848.

In scan mode of the circuit, the input terminal D1 of match multiplexers 302 receives an inverted version of the scan input signal SI via connection line 815. Specifically, when the scan enable signal SE is at a high logic level, the inverted scan enable signal SE_BAR is at a low logic level while PFET 841 and NFET 844 are turned off. At the same time, PFET 846 and NFET 847 are turned on, enabling the second string of transistors 845, 846, 847, 848 to control the voltage in connection line 815 (and hence the voltage at the input terminal D1). When the scan input signal SI is at a high logic level, NFET 848 is closed, setting input terminal D1 to a low logic level. Conversely, if the scan input signal SI is at a low logic level, PFET 845 is closed, setting input terminal D1 to a high logic level. Thus, the voltage received at input terminal D1 is the logical inverse of the scan input signal SI.

In a typical operation of the circuit, the scan mode is disabled and the input terminal D1 of match multiplexer 302 receives an inverted version of DATA via the connection line 815. Specifically, the scan enable signal SE is at a low logic level, the inverted scan enable signal SE_BAR is at a high logic level, thereby causing PFET 846 and NFET 847 to turn off. At the same time, PFET 841 and NFET 844 are turned on, causing the first string of transistors 841, 842, 843, 844 to control the voltage level in the connection line 815 the input terminal D1. When DATA is high logic level, NFET 843 is turned on and PFET 842 is turned off, connecting the input terminal D1 to the low reference voltage GND. When DATA is a low logic level, PFET 842 is turned on and NFET 843 is turned off, connecting the D1 terminal to the high reference voltage VDD. Thus, the voltage received at input terminal D1 is the logical inverse of DATA.

Example Method of Operating Flip Flip

Figure 9:
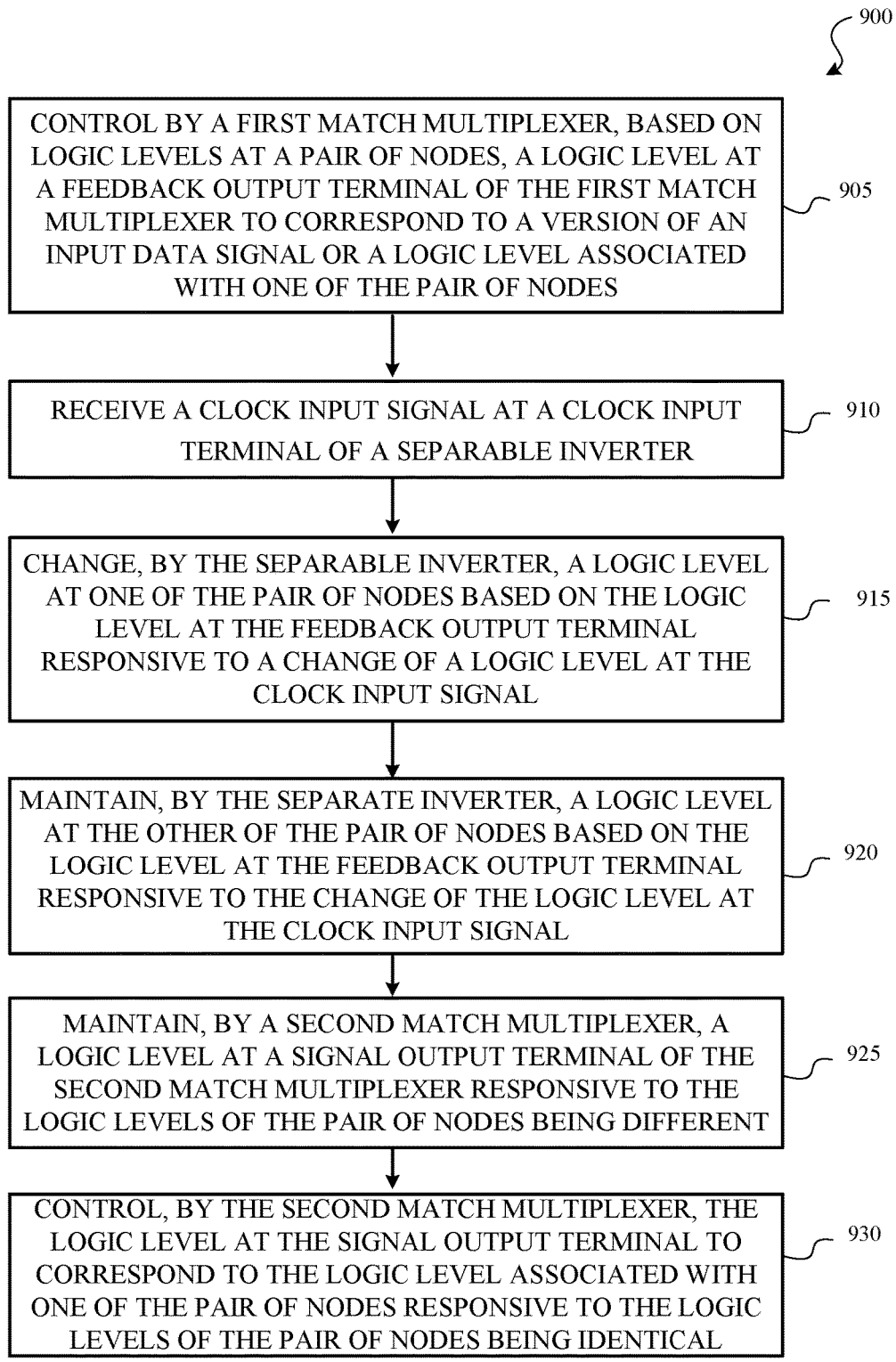
FIG. 9 is a flowchart illustrating operations of a flip flop, according to one embodiment.

FIG. 9 is a flowchart illustrating an example process 900 for the flip flop, according to one embodiment. The flip flop includes a first match multiplexer (e.g. match multiplexer 302), a separable inverter (e.g. separable inverter 304) and a second match multiplexer (e.g. match multiplexer 306) that performs some of the steps of the example process 900. The first match multiplexer controls 905, based on logic levels at a pair of nodes, a logic level at a feedback output terminal of the first match multiplexer to correspond to a version of an input data signal or a logic level associated with one of the pair of nodes. In one embodiment, the match multiplexer 302 sets the logic level at its feedback output terminal to be the inverse of an input data signal at its input terminal the logic level at the pair of nodes are different logic levels and the inverse logic level of one of the pair of nodes when the pair of nodes are at the same logic level.

The separable inverter receives 910 a clock input signal at a clock input terminal of a separable inverter. The separable inverter changes 915 a logic level at one of the pair of nodes based on the logic level at the feedback output terminal responsive to a change of a logic level at the clock input signal. In one embodiment, if the clock input signal is at a high logic level, the logic levels at output terminals Y0 and X0 of the separable inverter 304 are the inverse of the logic level at output terminal Q1 whereas if the clock input signal is at a low logic level, the output terminal Y0 is set to a high logic level and the output terminal X0 is set to a low logic level.

The separable inverter maintains 920 a logic level at the other of the pair of nodes based on the logic level at the feedback output terminal responsive to the change of the logic level at the clock input signal. In one embodiment, only one of the signals at the output terminal Y0 and X0 change with the clock input signal, since possible output voltages are a high logic level and a low logic level, both at a high logic level or a low logic level and any transition to these output voltages result in the change of the logic level of one node. For example, if the voltage at output terminals Y0 and X0 change from a high logic level and a low logic level to both a high logic level, the voltage at output terminal Y0 maintains a high logic level while the voltage at output terminal X0 changes from a low logic level to a high logic level.

The second match multiplexer maintains 925 a logic level at a signal output terminal of the second match multiplexer responsive to the logic levels of the pair of nodes being different.

The second match multiplexer controls 930 a logic level at a signal output terminal of the second match multiplexer to correspond to the logic level associated with one of the pair of nodes responsive to the logic levels of the pair of nodes being identical. In one embodiment, if the voltage at input terminal Y2 and X2 are at the identical logic level (i.e., logic high "1" or logic low "0"), the logic level at output terminal Q2 of the match multiplexer 306 is the inverse of the logic level at input terminal X2 whereas if the voltage at input terminals Y2 and X2 are different logic levels, the voltage at output terminal Q2 is the inverse of the logic level at input terminal D2.

The process described above with reference to FIG. 9 is merely an example. Other embodiments may include different and/or additional steps, or perform the steps in different orders.

Example Computing Device Storing Circuit Design

Figure 10:
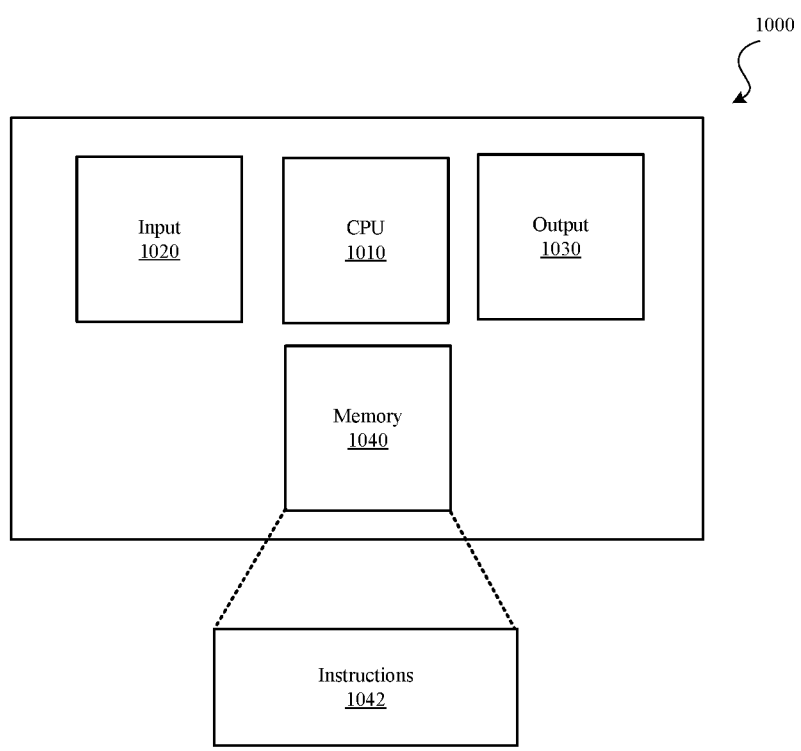
FIG. 10 is a block diagram illustrating an electronic device that stores a digital representation of a flip flop circuit for performing the functions of a flip flop in an integrated circuit, according to one embodiment.

FIG. 10 is a block diagram of a special-purpose computing device 1000 for storing a digital representation of a flip flop circuit or performing design operations associated with the flip flop circuit according to one embodiment. The computing device 1000 may include a CPU 1010, an input 1020, an output 1030, memory 1040 and an interconnect or bus connecting these components.

The digital representation of the flip flop circuit as described above in conjunction with FIGS. 3 through 9 may be stored as data in a non-transitory computer-readable medium (e.g., non-volatile memory within memory 1040). The digital representation may be stored may be at a behavioral level, register transfer level, logic component level, transistor level, and layout geometry-level of a flip flop circuit.

The computing device 1000 may also store instructions 1042 for performing circuit design operations to include and set parameters for the control circuit in an integrated circuit as described above in conjunction with FIGS. 3 through 9. The instructions 1042 may cause the processor 1010 to perform various operations associated with electronic design automation (EDA) including, but not limited to, synthesis, formal verification, simulation and emulation.

The disclosure herein has been described in particular detail with respect to a few possible embodiments. Those of skill in the art will appreciate that other embodiments may be practiced. First, the particular naming of the components and variables, capitalization of terms, the attributes, data structures, or any other programming or structural aspect is not mandatory or significant, and the mechanisms that implement the invention or its features may have different names, formats, or protocols. Also, the particular division of functionality between the various system components described herein is merely exemplary, and not mandatory; functions performed by a single system component may instead be performed by multiple components, and functions performed by multiple components may instead performed by a single component.

Some portions of above description present features in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times, to refer to these arrangements of operations as modules or by functional names, without loss of generality.

Unless specifically stated otherwise as apparent from the above discussion, it is appreciated that throughout the description, discussions utilizing terms such as "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the embodiments disclosed herein include process steps and instructions described herein in the form of an algorithm. It should be noted that the process steps and instructions could be embodied in software, firmware or hardware, and when embodied in software, could be downloaded to reside on and be operated from different platforms used by real time network operating systems.

The algorithms and operations presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will be apparent to those of skill in the art, along with equivalent variations. In addition, the present invention is not described with reference to any particular programming language. It is appreciated that a variety of programming languages may be used to implement the teachings of the present invention as described herein, and any references to specific languages are provided for invention of enablement and best mode of the present invention.

The embodiments disclosed herein are well suited to a wide variety of computer network systems over numerous topologies. Within this field, the configuration and management of large networks include storage devices and computers that are communicatively coupled to dissimilar computers and storage devices over a network, such as the Internet.

Finally, it should be noted that the language used in the specification has been principally selected for readability and instructional purposes, and may not have been selected to delineate or circumscribe the inventive subject matter. Accordingly, the disclosure herein is intended to be illustrative, but not limiting, of the scope of the invention, which is set forth in the following claims.

What is claimed is:

1. A flip-flop comprising:
   a first match multiplexer having a feedback output terminal, a first input terminal configured to receive a first control signal from a first node of a pair of nodes, a second input terminal configured to receive a second control signal from a second node of the pair of nodes, and a data input terminal configured to receive an input data signal, the first match multiplexer configured to control, based on logic levels at the pair of nodes, a logic level at the feedback output terminal to correspond to a version of the input data signal or a logic level associated with one of the pair of nodes;
   a separable inverter comprising a clock input terminal and a feedback input terminal coupled to the feedback output terminal, the separable inverter configured to change a logic level at one of the pair of nodes based on the logic level at the feedback output terminal but maintain a logic level at the other of the pair of nodes responsive to a change of a logic level at the clock input terminal; and
   a second match multiplexer configured to, based on the logic levels at the pair of nodes, maintain a logic level at a signal output terminal of the second match multiplexer or control a logic level at the signal output terminal to correspond to the logic level associated with one of the pair of nodes.

2. The flip-flop of claim 1, wherein:
   the version of the input data signal at the feedback output terminal has a logic level inverted relative to the logic level of the input data signal; and
   the logic level associated with one of the pair of nodes is inverted relative to the logic level at one of the pair of nodes.

3. The flip-flop of claim 1, wherein the first match multiplexer is configured to:
   control the logic level at the feedback output terminal to correspond to the version of the input data signal responsive to the logic levels of the pair of nodes being different, and
   control the logic level at the feedback output terminal to correspond to the logic level associated with at one of the pair of nodes responsive to the logic levels at the pair of nodes being identical.

4. The flip-flop of claim 1, wherein the first match multiplexer comprises:
   a first string of transistors connected in series between a first reference voltage and a second reference voltage lower than the first reference voltage, a first node in the first string of transistors connected to the feedback output terminal; and a second string of transistors connected in series between the first reference voltage and the second reference voltage, a second node in the second string of transistors connected to the feedback output terminal.

5. The flip-flop of claim 1, wherein:
the first string of transistors comprises:
a first transistor having a gate coupled to one of the pair of nodes,
a second transistor having a gate coupled to the data input terminal,
a third transistor having a gate coupled to the data input terminal, the first node between the second and the third transistors, and
a fourth transistor having a gate connected to the other of the pair of nodes; and
the second string of transistors comprises:
a fifth transistor having a gate coupled to the other of the pair of nodes, and
a sixth transistor having a gate coupled to one of the pair of nodes, the second node between the fifth and sixth transistors connected to the feedback output terminal.

6. The flip-flop of claim 5, the second match multiplexer comprises:
a third string of transistors connected in series between the first reference voltage and the second reference voltage, the third string of transistors comprising:
a seventh transistor having a gate coupled to the other of the pair of nodes, and
an eighth transistor having a gate coupled to one of the pair of nodes, a node between the seventh and eighth transistors coupled to the signal output terminal; and
a fourth string of transistors connected in series between the first reference voltage and the second reference voltage, the fourth string of transistors comprising: the first transistor,
a ninth transistor having a gate coupled to the signal output terminal,
a tenth transistor having a gate coupled to the signal output terminal, and the fourth transistor.

7. The flip-flop of claim 1, wherein the first match multiplexer is configured to operate the flip-flop in a scan mode responsive to receiving a scan enable signal.

8. The flip-flop of claim 1, wherein the separable inverter is configured to:
control the logic levels at the pair of nodes to become different responsive to the clock input terminal being at a first logic level; and
control the logic levels at the pair of nodes to become identical responsive to the clock input terminal being at a second logic level.

9. The flip-flop of claim 8, wherein the separable inverter comprises:
a plurality of first type of transistors configured to control a logic level of at least one of the pair of nodes to correspond to the first logic level responsive to logic levels at the clock input terminal and the feedback input terminal; and
a plurality of second type of transistors configured to control the logic level of at least one of the pair of nodes to correspond to the second logic level responsive to the logic levels at the clock input terminal and the feedback input terminal.

10. The flip-flop of claim 9, wherein the plurality of first type of transistors consist of three P-type field-effect transistors (FETs) and the plurality of the second type of transistors consist of three N-type FETs.

11. The flip-flop of claim 1, wherein the second match multiplexer is configured to:
control the logic level at the signal output terminal to maintain the logic level at the signal output terminal responsive to the logic levels the pair of nodes being different; and
control the logic level at the signal output terminal to correspond to the logic level associated with one of the pair of nodes responsive to the logic levels of the pair of nodes being identical.

12. The flip-flop of claim 11, further comprising an inverter between a data input of the second match multiplexer and the signal output terminal to maintain the logic level at the signal output terminal responsive to the logic levels of the pair of nodes being different.

13. A method of operating a flip-flop, comprising:
receiving a first control signal from a first node of a pair of nodes at a first input terminal of a first match multiplexer;
receiving a second control signal from a second node of the pair of nodes at a second input terminal of the first match multiplexer;
receiving an input data signal at a data input terminal of the first match multiplexer;
controlling, by the first match multiplexer, based on logic levels at the pair of nodes, a logic level at a feedback output terminal of the first match multiplexer to correspond to a version of the input data signal or a logic level associated with one of the pair of nodes;
receiving a clock input signal at a clock input terminal of a separable inverter;
changing, by the separable inverter, a logic level at one of the pair of nodes based on the logic level at the feedback output terminal responsive to a change of a logic level at the clock input signal;
maintaining, by the separable inverter, a logic level at the other of the pair of nodes based on the logic level at the feedback output terminal responsive to the change of the logic level at the clock input signal;
maintaining, by a second match multiplexer, a logic level at a signal output terminal of the second match multiplexer responsive to the logic levels of the pair of nodes being different; and
controlling, by the second match multiplexer, the logic level at the signal output terminal to correspond to the logic level associated with one of the pair of nodes responsive to the logic levels of the pair of nodes being identical.

14. The method of claim 13, wherein:
the version of the input data signal at the feedback output terminal has a logic level inverted relative to the logic level of the input data signal; and
the logic level associated with one of the pair of nodes is inverted relative to the logic level at one of the pair of nodes.

15. The method of claim 13, further comprising:
controlling, by the first match multiplexer, the logic level at the feedback output terminal to correspond to the version of the input data signal responsive to the logic levels the pair of nodes being different, and
controlling, by the first match multiplexer, the logic level at the feedback output terminal to correspond to the logic level associated with one of the pair of nodes responsive to the logic levels the pair of nodes being identical.

16. The method of claim 15, wherein controlling the logic level at the feedback output terminal to correspond to the version of the input data signal comprises:
controlling, by a plurality of first type of transistors, a logic level of at least one of the pair of nodes to correspond to a first logic level responsive to logic levels at the clock input terminal and a feedback input terminal; and
controlling, by a plurality of second type of transistors, the logic level of at least one of the pair of outputs to correspond to a second logic level responsive to the logic levels at the clock input terminal and the feedback input terminal.

17. The method of claim 16, wherein the plurality of first type of transistors consist of three P-type field-effect transistors (FETs) and the plurality of the second type of transistors consist of three N-type FETs.

18. The method of claim 13, further comprising operating the flip-flop in a scanning mode responsive to receiving a scan enabling signal at the first match multiplexer.

19. The method of claim 13, further comprising:
controlling, by the separable inverter, the logic levels at the pair of nodes to become different responsive to the clock input terminal being at a first logic level; and
controlling, by the separable inverter, the logic levels at the pair of nodes to become identical responsive to the clock input terminal being at a second logic level.

20. A non-transitory computer readable storage medium storing a digital representation of a flip-flop comprising:
a first match multiplexer having a feedback output terminal, a first input terminal configured to receive a first control signal from a first node of a pair of nodes, and a second input terminal configured to receive a second control signal from a second node of the pair of nodes, and a data input terminal configured to receive an input data signal, the first match multiplexer configured to control, based on logic levels at the pair of nodes, a logic level at the feedback output terminal to correspond to a version of the input data signal or a logic level associated with one of the pair of nodes;
a separable inverter comprising a clock input terminal, a feedback input terminal coupled to the feedback output terminal, the separable inverter configured to change a logic level at one of the pair of nodes based on the logic level at the feedback output terminal but maintain a logic level at the other of the pair of nodes responsive to a change of a logic level at the clock input terminal; and
a second match multiplexer configured to, based on the logic levels at the pair of nodes, maintain a logic level at a signal output terminal of the second match multiplexer or control a logic level at the signal output terminal to correspond to the logic level associated with one of the pair of nodes.

* * * * *

UNITED STATES PATENT AND TRADEMARK OFFICE
CERTIFICATE OF CORRECTION

PATENT NO. : 9,929,723 B2
APPLICATION NO. : 15/066809
DATED : March 27, 2018
INVENTOR(S) : Victor Zyuban et al.

Page 1 of 1

It is certified that error appears in the above-identified patent and that said Letters Patent is hereby corrected as shown below:

In the Claims

Claim 3, Line 61: replace "the logic level associated with at one of" with -- the logic level associated with one of --
Claim 11, Line 9: replace "the logic levels the pair of nodes" with -- the logic levels of the pair of nodes --
Claim 15, Lines 64-65: replace "the logic levels the pair of nodes" with -- the logic levels of the pair of nodes --
Claim 15, Line 2: replace "the logic levels the pair of nodes" with -- the logic levels of the pair of nodes --

Signed and Sealed this
Twentieth Day of November, 2018

Andrei Iancu
*Director of the United States Patent and Trademark Office*